(12) United States Patent
Gulani et al.

(10) Patent No.: US 10,859,651 B2
(45) Date of Patent: Dec. 8, 2020

(54) SYSTEM AND METHOD FOR CONTROLLING EFFECTS OF MAGNETIC FIELD INHOMOGENEITIES ON MAGNETIC RESONANCE FINGERPRINTING (MRF)

(71) Applicant: Case Western Reserve University, Cleveland, OH (US)

(72) Inventors: Vikas Gulani, Shaker Heights, OH (US); Mark A. Griswold, Shaker Heights, OH (US); Alice Yang, Cleveland Heights, OH (US); Yun Jiang, Cleveland Heights, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 122 days.

(21) Appl. No.: 15/945,714

(22) Filed: Apr. 4, 2018

(65) Prior Publication Data

US 2018/0292483 A1    Oct. 11, 2018

Related U.S. Application Data

(60) Provisional application No. 62/483,179, filed on Apr. 7, 2017.

(51) Int. Cl.
| | |
|---|---|
| *G01R 33/48* | (2006.01) |
| *G01R 33/565* | (2006.01) |
| *G01R 33/561* | (2006.01) |
| *G01R 33/3875* | (2006.01) |
| *G01R 33/385* | (2006.01) |

(52) U.S. Cl.
CPC ....... *G01R 33/4828* (2013.01); *G01R 33/561* (2013.01); *G01R 33/5614* (2013.01); *G01R 33/5659* (2013.01); *G01R 33/385* (2013.01); *G01R 33/3875* (2013.01)

(58) Field of Classification Search
CPC .............. G01R 33/561; G01R 33/5614; G01R 33/5659
See application file for complete search history.

(56) References Cited

U.S. PATENT DOCUMENTS

| 8,723,518 | B2 | 5/2014 | Seiberlich | |
|---|---|---|---|---|
| 2012/0235678 | A1 | 9/2012 | Seiberlich | |
| 2013/0271132 | A1* | 10/2013 | Griswold | G01R 33/5612 324/309 |
| 2014/0167754 | A1* | 6/2014 | Jerecic | G01R 33/56 324/309 |

(Continued)

OTHER PUBLICATIONS

Ma D., et al., in "Magnetic Resonance Fingerprinting," Nature, 2013; 495(7440):187-192.

*Primary Examiner* — Alvaro E Fortich
(74) *Attorney, Agent, or Firm* — Quarles & Brady LLP

(57) ABSTRACT

A system and method for performing magnetic resonance fingerprinting (MRF) is provided that includes performing a pulse sequence that is sensitive to field inhomogeneities to acquire a series of signal evolutions form a region of interest (ROI) of the subject to form MRF data. The method also includes varying field inhomogeneities across the ROI to acquire the series of signal evolutions, comparing the MRF data with an MRF dictionary to determine at least one tissue property of the subject in the ROI, and producing at least one map of the at least one tissue property.

19 Claims, 4 Drawing Sheets

(56) References Cited

U.S. PATENT DOCUMENTS

| | | | |
|---|---|---|---|
| 2015/0137813 A1* | 5/2015 | Chenevert | G01R 33/56341 324/322 |
| 2015/0301141 A1 | 10/2015 | Griswold | |
| 2015/0301147 A1* | 10/2015 | Gulani | G01R 33/56563 324/309 |
| 2015/0302579 A1* | 10/2015 | Griswold | G01R 33/5608 382/128 |
| 2015/0346300 A1* | 12/2015 | Setsompop | G01R 33/4828 324/309 |
| 2015/0346301 A1* | 12/2015 | Cauley | G01R 33/4828 324/309 |
| 2016/0116559 A1* | 4/2016 | Cohen | G01R 33/561 324/309 |
| 2016/0299206 A1* | 10/2016 | Cohen | G01R 33/54 |
| 2017/0003365 A1* | 1/2017 | Rosen | G01R 33/445 |

* cited by examiner

SYSTEM AND METHOD FOR CONTROLLING EFFECTS OF MAGNETIC FIELD INHOMOGENEITIES ON MAGNETIC RESONANCE FINGERPRINTING (MRF)

CROSS-REFERENCE TO RELATED APPLICATIONS

This application is based on, claims priority to, and incorporates herein by reference for all purposes, U.S. Provisional Application Ser. No. 62/483,179, filed Apr. 7, 2018, and entitled, "SYSTEM AND METHOD FOR CONTROLLING EFFECTS OF MAGNETIC FIELD INHOOGENEITIES ON MAGNETIC RESONANCE FINGERPRINTING (MRF)."

STATEMENT REGARDING FEDERALLY SPONSORED RESEARCH

N/A.

BACKGROUND

Characterizing tissue species using nuclear magnetic resonance ("NMR") can include identifying different properties of a resonant species (e.g., T1 spin-lattice relaxation, T2 spin-spin relaxation, proton density). Other properties like tissue types and super-position of attributes can also be identified using NMR signals. These properties and others may be identified simultaneously using magnetic resonance fingerprinting ("MRF"), which is described, as one example, by D. Ma, et al., in "Magnetic Resonance Fingerprinting," *Nature,* 2013; 495(7440):187-192.

Conventional magnetic resonance imaging ("MRI") pulse sequences include repetitive similar preparation phases, waiting phases, and acquisition phases that serially produce signals from which images can be made. The preparation phase determines when a signal can be acquired and determines the properties of the acquired signal. For example, a first pulse sequence may produce a T1-weighted signal at a first echo time ("TE"), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Currently in the clinic, magnetic resonance imaging (MRI) technology produces images that can vary between scanners, technologists, and scan settings. These images are interpreted qualitatively, which leaves room for variation in diagnosis. Unlike conventional MRI, MRF employs a series of varied sequence blocks that simultaneously produce different signal evolutions in different resonant species (e.g., tissues) to which the radio frequency ("RF") is applied. The signals from different resonant tissues will, however, be different and can be distinguished using MRF. The different signals can be collected over a period of time to identify a signal evolution for the volume. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary. As such, MRF can help to reduce the variability of the traditional qualitative images and can allow for more standardized diagnosis.

MRF is an efficient and effective technique for securing quantitative information. However, increased efficiency and reduced scanner time is advantageous and a key component to driving clinical use.

SUMMARY OF THE DISCLOSURE

The present disclosure addresses the aforementioned drawbacks by providing a system and method that recognizes that scan efficiency can be improved by planning or optimizing the encoding using field inhomogeneities. Though anathema to traditional MR or NMR data acquisition strategies, which seek to minimize field inhomogeneities, the present disclosure harnesses field inhomogeneities as an imaging parameter that can be varied to elicit the signal evolutions that form MRF data. Acquisition time can be reduced by undersampling or acquiring multiple voxels simultaneously. Individual voxels can then be separated based on their spatial incoherence due to the field inhomogeneity.

In accordance with one aspect of the disclosure, a method is provided for performing magnetic resonance fingerprinting (MRF). The method includes performing a pulse sequence that is sensitive to field inhomogeneities to acquire a series of signal evolutions form a region of interest (ROI) of the subject to form MRF data. The method also includes varying field inhomogeneities across the ROI to acquire the series of signal evolutions, comparing the MRF data with an MRF dictionary to determine at least one tissue property of the subject in the ROI, and producing at least one map of the at least one tissue property.

In accordance with another aspect of the disclosure, a system is provided that includes a magnet system configured to generate a polarizing magnetic field about at least a portion of a subject, a magnetic gradient system including a plurality of magnetic gradient coils configured to apply at least one magnetic gradient field to the polarizing magnetic field, and a radio frequency (RF) system configured to apply an RF field to the subject and to receive magnetic resonance signals from the subject using a coil array. The system also includes a computer system programmed to control the magnetic gradient system and the RF system to perform a pulse sequence that is sensitive to field inhomogeneities while varying field inhomogeneities across the ROI to acquire a series of signal evolutions form a region of interest (ROI) of the subject to form MRF data. The system is further programmed to compare the MRF data with an MRF dictionary to determine at least one tissue property of the subject in the ROI and produce at least one map of the at least one tissue property.

The foregoing and other aspects and advantages of the present disclosure will appear from the following description. In the description, reference is made to the accompanying drawings that form a part hereof, and in which there is shown by way of illustration a preferred embodiment.

This embodiment does not necessarily represent the full scope of the invention, however, and reference is therefore made to the claims and herein for interpreting the scope of the invention.

DETAILED DESCRIPTION

Figure 1:
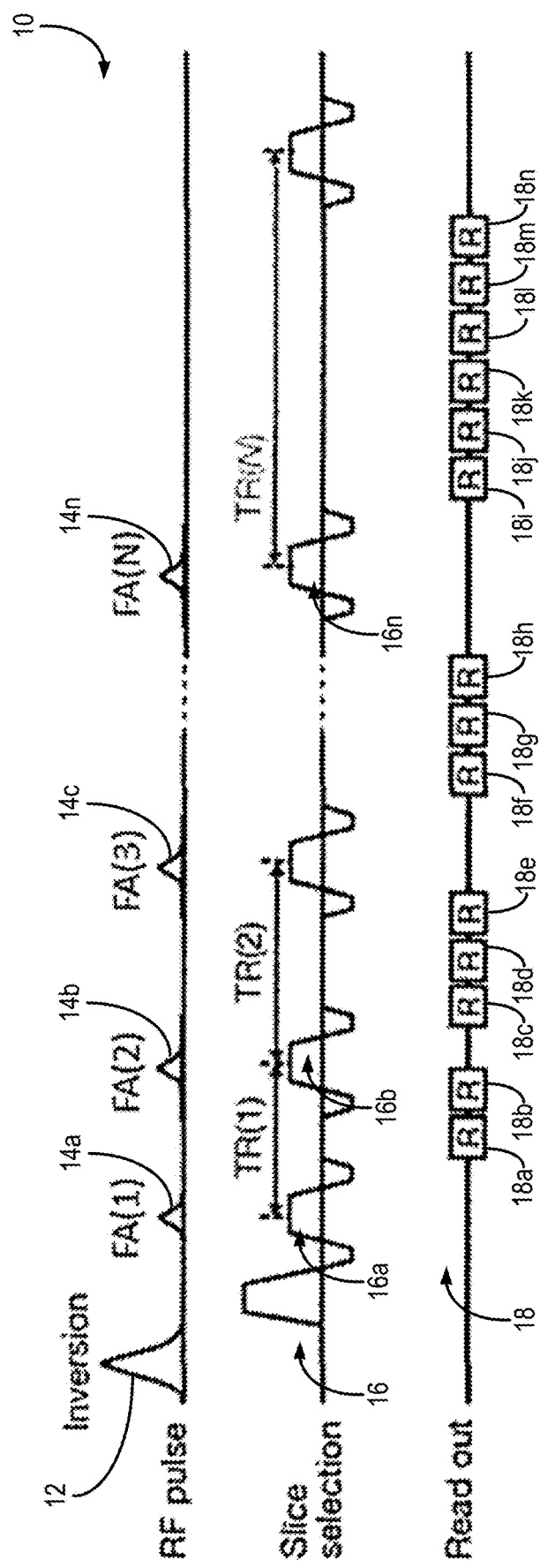
FIG. 1 is a pulse sequence diagram of one, non-limiting example of a pulse sequence in accordance with the present disclosure.

Magnetic resonance fingerprinting ("MRF") is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency ("RF") energy is applied to a volume that has both bone and muscle tissue, then both the bone and muscle tissue will produce a nuclear magnetic resonance ("NMR") signal; however, the "bone signal" represents a first resonant species and the "muscle signal" represents a second resonant species, and thus the two signals will be different. These different signals from different species can be collected simultaneously over a period of time to collect an overall "signal evolution" for the volume.

The measurements obtained in MRF techniques are achieved by varying the acquisition parameters from one repetition time ("TR") period to the next, which creates a time series of signals with varying contrast. Examples of acquisition parameters that can be varied include flip angle ("FA"), RF pulse phase, TR, echo time ("TE'), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

From these measurements, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; $N_{RF}$ is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1, T_2, D)$ is a signal decay due to relaxation differences; and $M_0$ is the magnetization in the default or natural alignment to which spins align when placed in the main magnetic field.

While $E_i(T_1,T_2,D)$ is provided as an example, in different situations, the decay term, $E_i(T_1,T_2,D)$, may also include additional terms, $E_i(T_1,T_2,D, \ldots)$ or may include fewer terms, such as by not including the diffusion relaxation, as $E_i(T_1,T_2)$ or $E_i(T_1,T_2, \ldots)$. Also, the summation on "j" could be replace by a product on "j".

The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Thus, in MRF, a unique signal timecourse is generated for each pixel. This timecourse evolves based on both physiological tissue properties such as T1 or T2 as well as acquisition parameters like flip angle (FA) and repetition time (TR). This signal timecourse for the pixel can then be matched to an entry in the dictionary, which is a collection of possible timecourses calculated using a range of possible tissue property values and knowledge of the quantum physics that govern the signal evolution. Upon matching the measured signal timecourse to a specific dictionary entry, the tissue properties corresponding to that dictionary entry can be identified. A fundamental criterion in MRF is that spatial incoherence be maintained to help separate signals that are mixed due to undersampling. In other words, signals from various locations should differ from each other, in order to be able to separate them when aliased.

Previously, accomplishing this incoherence depended largely on the trajectory used. However, the present disclosure recognizes that off-resonance or changes in the magnetic field, which are conventionally undesirable, can help improve uniqueness of MRF signals from different locations. Traditionally, field inhomogeneities can distort the MR image and effort is spent to correct and remove them. With MRF, the present disclosure recognizes that the field inhomogeneities can actually be utilized as spatial information to un-alias pixels. This is because field inhomogeneity differences can yield dramatically different signal timecourses in any two given pixels even if all other tissue properties are identical.

Thus, the present disclosure recognizes that scan efficiency can be improved by optimizing the encoding using field inhomogeneities. This is anathema to traditional MR or NMR data acquisition strategies, which seek to minimize field inhomogeneities. Acquisition time can be reduced by undersampling or acquiring multiple voxels simultaneously. Individual voxels can then be separated based on their spatial incoherence due to the field inhomogeneity.

In one non-limiting example, an encoding scheme can be used that applies a field inhomogeneity that is linear across the field-of-view. For example, in on implementation, a balanced steady-state free precession (bSSFP) sequence can be utilized to harness the fact that the sequence is sensitive to field inhomogeneities and can result in signal voids in certain parts of the field-of-view. Using a bSSFP-based MRF sequence and this linear field inhomogeneity, these signal voids can be induced in a predictable manner. By changing the TR over the course of the acquisition, the signals voids move around the field-of-view. This can help differentiate signals from different locations.

For example, one non-limiting example of a pulse sequence 10 is illustrated in FIG. 1 that sweeps these null bands across the field-of-view. The pulse sequence begins with an inversion pulse 12 and a series of excitation pulses 14*a*, 14*b*, 14*c* . . . 14*n*, that share a constant flip angle, denoted by FA(1), FA(2), FA(3) . . . FA(N). As illustrated, the excitation pules 14*a*, 14*b*, 14*c* . . . 14*n* are increasingly separated due to increasing TRs, denoted by TR(1), TR(2) . . . TR(N), which may be correlated with the slice-selection gradients 16*a*, 16*b* . . . 16*n*. This variation causes the null bands to cycle through the field-of-view. Multiple readouts 18 can be performed per TR to capture this information. As the TRs increase over the course of the pulse sequence 10, more readouts 18 can be performed. In the illustrated, non-limiting acquisition, only two readouts 18*a* and 18*b* are performed during TR(1) and the number of readouts 18 and grows (from 2 to 3—18*c*, 18*d*, 18*e*; and 18*f*, 18*g*, 18*h*) to ultimately six readouts (18*i*, 18*j*, 18*k*, 18*l*, 18*m*, 18*n*) by TR(N).

Figure 2A:
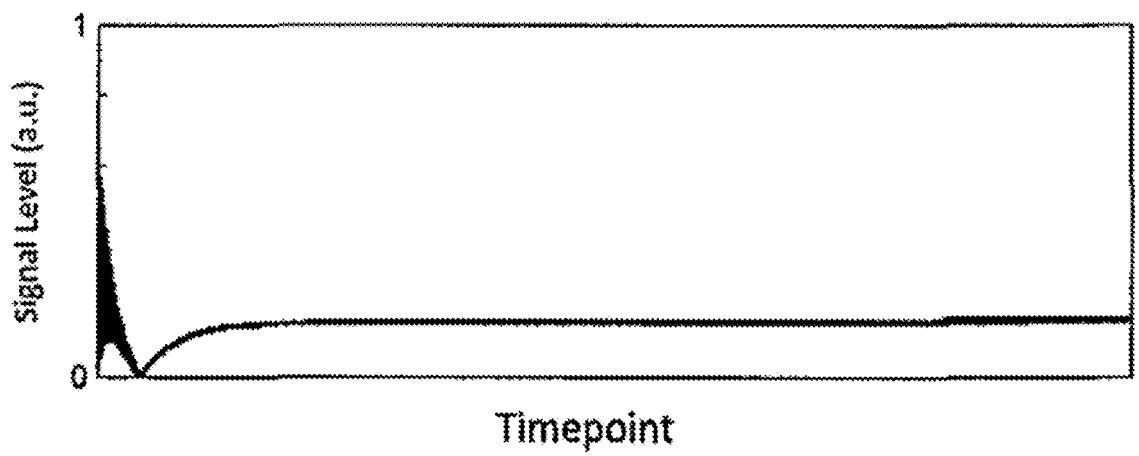
FIG. 2A is a graph of signal curve for a voxel at the center of the field-of-view using the pulse sequence of FIG. 1.
Figure 2B:
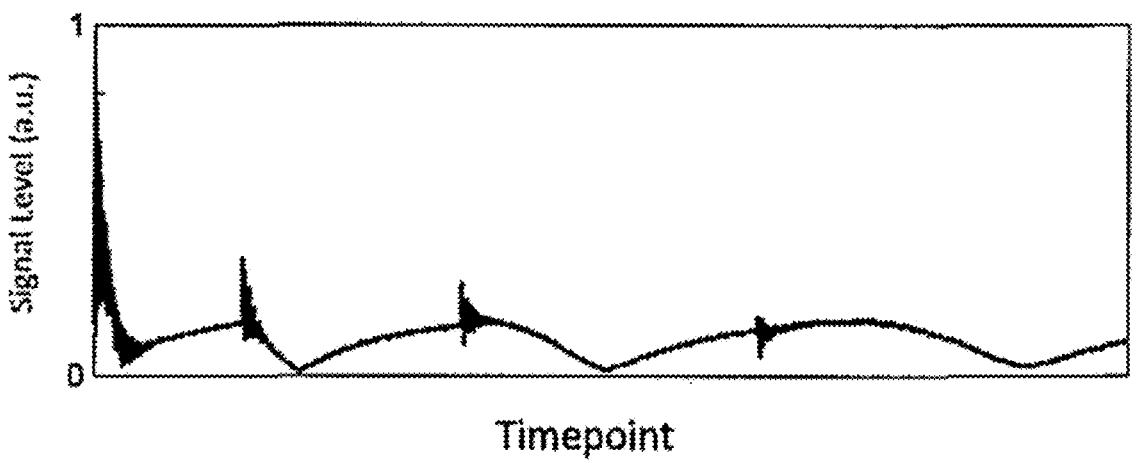
FIG. 2B is a graph of a signal curve for a voxel at the periphery of the field-of-view using the pulse sequence of FIG. 1.

In this non-limiting example, the linear field inhomogeneity is centered about the center of the field of view. Null bands sweep outward from the center and, thus, appear at different locations at different timepoints. Representative signal curves are shown in FIGS. 2A and 2B. Specifically, FIG. 2A shows that the signal curve for a voxel at the center of the field-of-view sees no additional null bands and stays at steady-state. On the other hand, FIG. 2B shows the signal a voxel away from the center of the field-of-view with the same T1 and T2. As shown, this voxel experiences null bands throughout the acquisition as TR increases.

Thus, the center voxel does not experience any field inhomogeneity offset and therefore has no signal voids aside from inversion recovery. However, voxels away from the center of the field-of-view experience field inhomogeneity and null bands appear at various timepoints. Note the oscillations in the signal curve of FIGS. 2A and 2B are due to sharp increases in TR at those timepoints.

Figure 3:
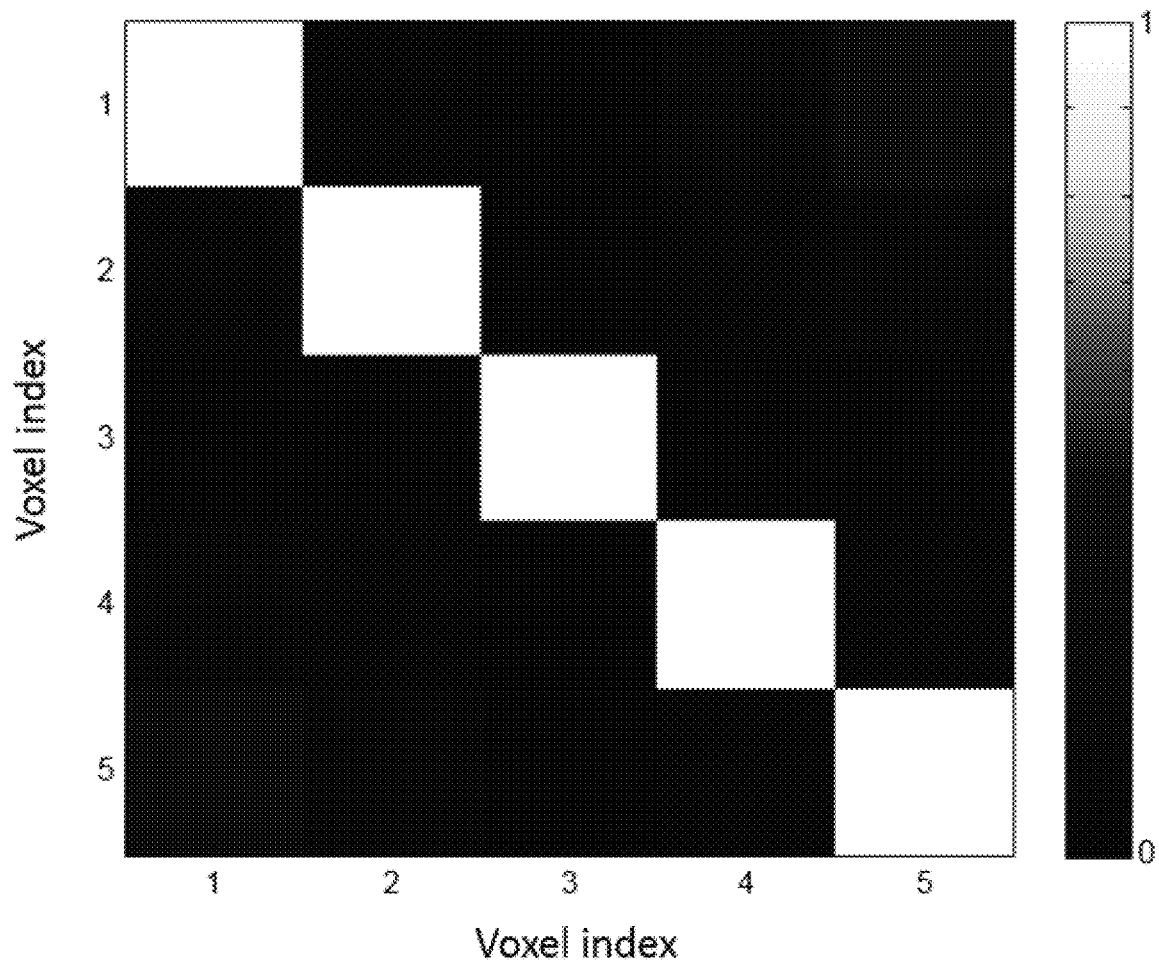
FIG. 3 is a cross-correlation matrix for representative voxels located at different positions of a field-of-view using the pulse sequence of FIG. 1.

Notably, the location and timing of these null bands can be predicted, and this knowledge be used to encode the spatial separation of signals. Due to the inhomogeneous field, signals from separate voxels are more unique and can be made to be near-orthogonal to each other. For example, FIG. 3 shows a cross-correlation matrix of five representative voxels across the field-of-view. This orthogonality presents the opportunity to condense and acquire all voxels simultaneously as one mixed signal to dramatically reduce scan time. The mixed signal can then be separated into signals from individual voxels in data processing and still provide quantitative maps through the MRF matching process.

In particular, FIG. 3 shows a non-limiting example of a cross-correlation matrix for five representative voxels located at different positions in the field-of-view. All five voxels have the same T1 and T2 values. The inhomogeneous field yields a near-ideal cross-correlation matrix, as the signals from different locations are now more independent and near-orthogonal (i.e., the values at 1,1; 2,2; 3,3; 4,4; and 5,5 are near or effectively 1 and the values at all other positions are near or effectively 0). This helps to separate individual signals from one mixed signal, providing an opportunity to accelerate scans.

Various configurations of field inhomogeneities can be applied, for example, using shim coils or gradients. The non-limiting example data shown here was generated based on static field inhomogeneities, but dynamic field inhomogeneities can be used to yield unique signal evolutions. Configurations of both static and dynamic field inhomogeneities can be used to create an acquisition scheme with a desired efficiency.

Figure 4:
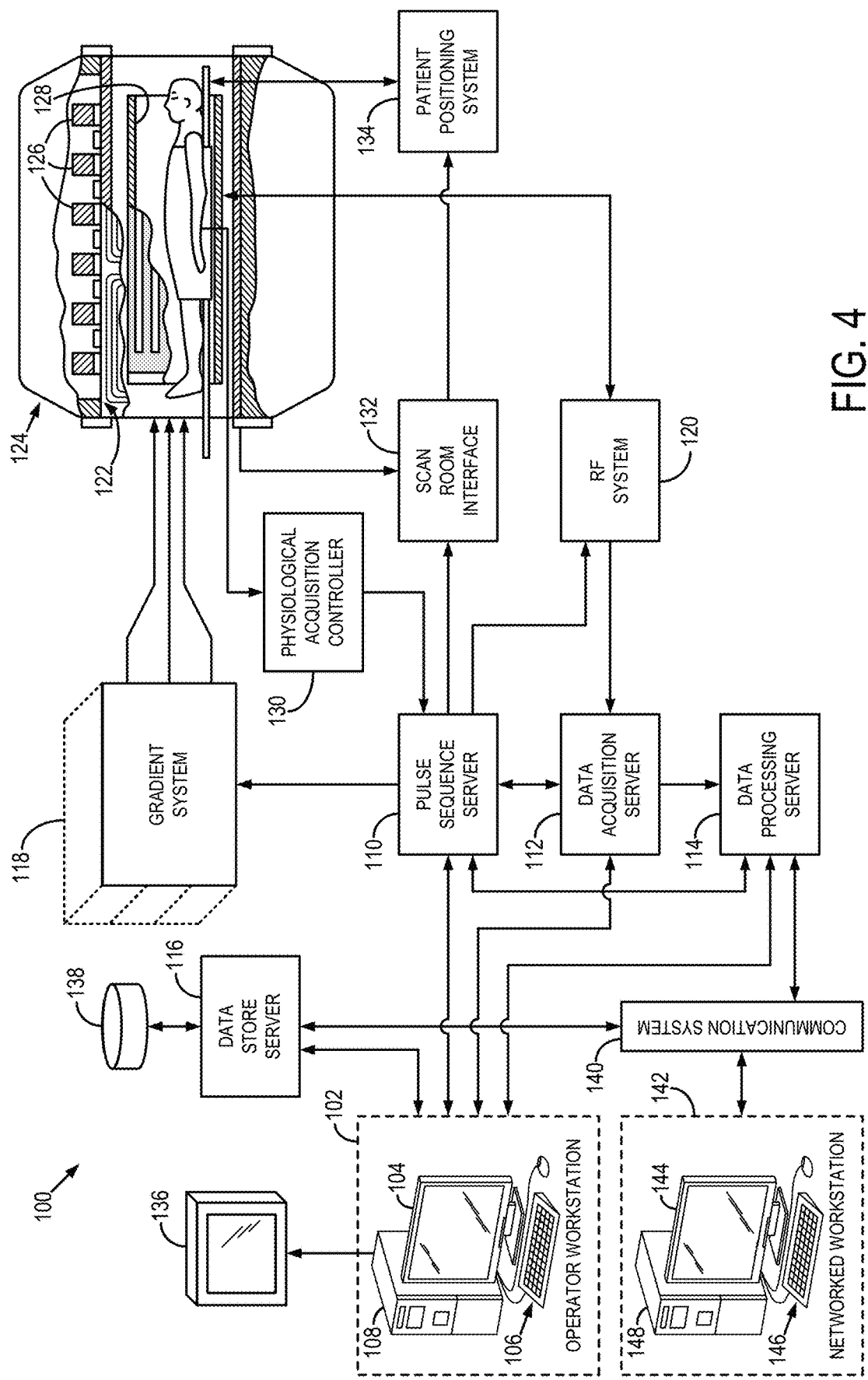
FIG. 4 is a block diagram of an example magnetic resonance imaging ("MRI") system that can implement the methods described in the present disclosure.

Referring particularly now to FIG. 4, an example of an MRI system 100 that can implement the methods described here is illustrated. The MRI system 100 includes an operator workstation 102 that may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{3}$$

and the phase of the received magnetic resonance signal may also be determined according to the following relationship:

$$\varphi = \tan^{-1}\left(\frac{Q}{I}\right). \tag{4}$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

The present disclosure has described one or more preferred embodiments, and it should be appreciated that many equivalents, alternatives, variations, and modifications, aside from those expressly stated, are possible and within the scope of the invention.

The invention claimed is:

1. A method for performing magnetic resonance fingerprinting (MRF) comprising:
performing a pulse sequence that induces null bands in the presence in field inhomogeneities, wherein the pulse sequence includes at least one of variable separation of excitation pulses or a varying repetition time (TR), to move the null bands around a region of interest (ROI) of the subject and acquire signal evolutions from the ROI in the presence of varying field inhomogeneities to form MRF data;
comparing the MRF data with an MRF dictionary to determine at least one tissue property of the subject in the ROI; and
producing at least one map of the at least one tissue property.

2. The method of claim 1 wherein comparing includes separating the signal evolutions from each voxel based on respective spatial incoherence at each voxel caused by the field inhomogeneity.

3. The method of claim 1 wherein comparing the MRF data with the MRF dictionary includes comparing the signal evolutions with known signal evolutions correlated with known tissue properties to identify the at least one tissue property.

4. The method of claim 1 wherein the pulse sequence includes a balanced steady state free precession (bSSFP) pulse sequence.

5. The method of claim 1 wherein varying the field inhomogeneities across the ROI includes applying a magnetic field gradient across the ROI.

6. The method of claim 5 wherein the magnetic field gradient includes a linear gradient.

7. The method of claim 1 wherein varying the field inhomogeneities across the ROI includes varying a repetition time (TR) between excitation pulses of the pulse sequence and a magnetic field gradient applied during the TR.

8. The method of claim 1 further comprising varying a number of readouts during each repetition time (TR) of the pulse sequence to acquire the signal evolutions.

9. The method of claim 1 wherein the at least one tissue property includes longitudinal relaxation time ($T_1$), transverse relaxation time ($T_2$), main or static magnetic field map ($B_0$), or proton density ($\rho$).

10. A system comprising:
a magnet system configured to generate a polarizing magnetic field about at least a portion of a subject;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array;
a computer system programmed to:
control the magnetic gradient system and the RF system to perform a pulse sequence that sweeps field inhomogeneities across a region of interest (ROI) of the subject by increasingly separating excitation pulses by increasing repetition times (TRs);
forming MRF data by acquiring signal evolutions from the ROI in the presence of sweeping field inhomogeneities caused at least in part by increasingly separating the excitation pulses by the increasing TRs of the pulse sequence;
compare the MRF data with an MRF dictionary to determine at least one tissue property of the subject in the ROI; and
produce at least one map of the at least one tissue property.

11. The system of claim 10 wherein the computer system is further programmed to separate the signal evolutions from each voxel in the ROI based on respective spatial incoherence at each voxel caused by the field inhomogeneity.

12. The system of claim 10 wherein the computer system is further programmed to compare the signal evolutions with known signal evolutions correlated with known tissue properties to identify the at least one tissue property.

13. The system of claim 10 wherein the pulse sequence includes a balanced steady state free precession (bSSFP) pulse sequence.

14. The system of claim 10 wherein varying the field inhomogeneities across the ROI includes applying a magnetic field gradient across the ROI.

15. The system of claim 14 wherein the magnetic field gradient includes a linear gradient.

16. The system of claim 10 wherein the computer system is further programmed to vary a magnetic field gradient applied during the TRs to vary the field inhomogeneities across the ROI.

17. The system of claim 10 wherein the computer system is further programmed to vary a number of readouts during each repetition time (TR) of the pulse sequence to acquire the signal evolutions.

18. The system of claim 10 wherein the at least one tissue property includes longitudinal relaxation time ($T_1$), transverse relaxation time ($T_2$), main or static magnetic field map ($B_0$), or proton density ($\rho$).

19. The system of claim 10 further comprising a display to display the at least one map of the at least one tissue property.

* * * * *

UNITED STATES PATENT AND TRADEMARK OFFICE
CERTIFICATE OF CORRECTION

PATENT NO. : 10,859,651 B2
APPLICATION NO. : 15/945714
DATED : December 8, 2020
INVENTOR(S) : Vikas Gulani et al.

It is certified that error appears in the above-identified patent and that said Letters Patent is hereby corrected as shown below:

In the Specification

Please insert the following in Column 1, starting at Line 20, below the heading STATEMENT REGARDING FEDERALLY SPONSORED RESEARCH:
--This invention was made with government support under EB016728 and EB017219 awarded by the National Institutes of Health. The government has certain rights in the invention.--

Signed and Sealed this
Twenty-fourth Day of January, 2023

Katherine Kelly Vidal
*Director of the United States Patent and Trademark Office*